(12) United States Patent
Jacquinot et al.

(10) Patent No.: US 6,386,950 B1
(45) Date of Patent: May 14, 2002

(54) PROCESS FOR MECHANICAL CHEMICAL POLISHING OF LAYER OF ALUMINIUM OR ALUMINIUM ALLOY CONDUCTING MATERIAL

(75) Inventors: Eric Jacquinot, Trosly Breuil; Pascal Letourneau, Cessy; Maurice Rivoire, Meylan, all of (FR)

(73) Assignee: Clariant (France) S.A., Puteaux (FR)

( * ) Notice: Subject to any disclaimer, the term of this patent is extended or adjusted under 35 U.S.C. 154(b) by 0 days.

(21) Appl. No.: 09/506,045

(22) Filed: Feb. 17, 2000

(30) Foreign Application Priority Data

Feb. 18, 1999 (FR) .............................. 99 02005

(51) Int. Cl.$^7$ ................................. B24B 1/00
(52) U.S. Cl. ........................... 451/41; 451/60; 51/307; 252/79.1
(58) Field of Search .................... 451/41, 60; 252/29.1, 252/79.2, 186.1, 187.1, 187.2, 187.31, 186.43, 79.1; 438/692–693, 691, 695; 216/89–100, 102; 51/307; 106/3

(56) References Cited

U.S. PATENT DOCUMENTS

| 5,431,777 | A | * | 7/1995 | Austin et al. ............ 156/622.1 |
| 5,647,989 | A | * | 7/1997 | Hayashi et al. ............. 210/641 |
| 5,866,031 | A | | 2/1999 | Carpio et al. |
| 5,885,334 | A | * | 3/1999 | Suzuki et al. ................... 106/3 |
| 6,044,851 | A | * | 4/2000 | Grieger et al. ............... 134/1.3 |

FOREIGN PATENT DOCUMENTS

| EP | 0 520 109 | 12/1992 |
| EP | 0 779 655 | 6/1997 |
| EP | 0 853 335 | 7/1998 |
| EP | 0 896 042 | 2/1999 |
| FR | 2 754 937 | 4/1998 |

OTHER PUBLICATIONS

French Search Report.
Derwent Patent Family Abstract for FR 2 754 937.
EPO Search Report (References previously submitted).

* cited by examiner

Primary Examiner—George Nguyen
(74) Attorney, Agent, or Firm—Richard P. Silverman

(57) ABSTRACT

Process for mechanical chemical polishing of a layer of an aluminium or aluminium alloy conducting material used in the microelectronics semi-conductors industry in which said aluminium or aluminium alloy layer is abraded using an abrasive composition which comprises an alkaline aqueous suspension of individualized colloidal silica particles not linked to each other by siloxane bonds, a tetraalkylammonium hydroxide and an oxidizing agent.

16 Claims, No Drawings

PROCESS FOR MECHANICAL CHEMICAL POLISHING OF LAYER OF ALUMINIUM OR ALUMINIUM ALLOY CONDUCTING MATERIAL

FIELD OF THE INVENTION

The present invention relates to a process for mechanical chemical polishing of a layer of an aluminium or aluminium alloy conducting material used in the microelectronics industry for semi-conductors as material which constitutes interconnecting tracks.

BACKGROUND OF THE INVENTION

Electronic devices made on a silicon slice must be connected to each other by means of interconnecting tracks to constitute the desired electronic circuit. Currently, these interconnecting tracks are most often defined using an aluminium-based film. The aluminium can be associated with silicon or (and) copper in weak proportions in order to increase its resistance to electromigration.

The interconnecting tracks of semi-conductors are usually made according the following sequence: an aluminium or aluminium alloy film approximately 1 $\mu$m thick is deposited by bombardment of an aluminium or aluminium alloy target by means of a beam of electrons or beam of ions (sputtering); the design of the interconnecting circuit is then transferred there by photolithography then by reactive ionic etching (RIE). The tracks thus defined must be electrically isolated, they are also covered with a dielectric layer, usually based on silicon oxide, most often obtained by decomposition in the vapour phase of tetraethylorthosilicate (TEOS). This layer is then planarized by mechanical chemical polishing.

The damascene process constitutes an alternative solution which allows interconnecting tracks to be made of aluminium whilst reducing the number of stages required. It consists of depositing a silicon oxide based dielectric layer on a substrate. In this dielectric layer, the contact holes and trenches which reproduce the design of the interconnecting circuit are then formed by two photolithographies and successive reactive ionic etchings. An aluminium or aluminium alloy layer is then deposited, which is polished by mechanical chemical polishing until the surface of the dielectric layer is reached. The aluminium thus remains only in the contacts and the trenches.

The damascene process allow problems linked to the reactive ionic etching of aluminium to be avoided: poor selectivity of aluminium etching compared with its countermask in resin and difficult control of the profile of aluminium tracks.

To carry out mechanical chemical polishing of the aluminium or aluminium alloy layer, two phenomena must be avoided:

an attack on the subjacent silicon oxide layer, also called erosion. This introduces ridges locally and is counter-productive to the desired aim of planarization.

an over-polishing of the interconnecting lines in the trenches, also called "dishing". Not only does this phenomenon also generate ridges, but also reduces the thickness of the interconnecting lines, and for this reason, increases their resistance.

These two phenomena are mainly due to a poor polishing uniformity of the aluminium or aluminium alloy. In fact, an imperfect removal of the metallic layer generally imposes significant over-polishing to avoid any risk of electric conduction between the different electronic devices, which leads to over-polishing the interconnecting lines and the dielectric zones already revealed.

The aluminium polishing stage should thus not only be uniform but also result in an excellent surface state. In fact, aluminium is a soft and malleable metal which is difficult to polish without scratches.

These scratches can be generated in two main ways:

aluminium oxide, which forms naturally on the surface of aluminium, is a harder material than aluminium. The particles of this aluminium oxide layer, once abraded, can agglomerate then scratch the surface of the aluminium. An abrasive composition must thus be used which minimizes the formation of surface aluminium oxide and/or avoids the agglomeration of abraded aluminium oxide particles, the particles which constitute the abrasive composition can also scratch the surface of the aluminium if their form and their roughness are badly controlled, which favours the colloidal suspensions of silica more than abrasives based on fumed silica or aluminium oxide.

It was proposed in EP-A-0 779 655 to use an abrasive composition comprising a suspension of fumed silica for polishing aluminium or aluminium alloy surfaces.

WO-A-97/13889 describes a process intended for polishing aluminium, copper, nickel or tantalum films using an abrasive solution comprising a suspension of aluminium oxide particles.

At a different stage of manufacturing electronic circuits, very much upstream, EP-A-0 520 109 describes a primary polishing process for silicon trenches using a composition comprised of a colloidal solution of silica stabilized by ammonium hydroxide, a bactericide of the quaternary ammonium hydroxide family, and up to 0.1% by weight of chlorite or sodium hypochlorite.

At yet another different stage of manufacturing electronic circuits, EP-A-0 853 335 describes a selective polishing process between a silicon oxide layer and a silicon nitrate layer using a modified slurry obtained by combining a slurry with a tetramethylammonium salt, a base and hydrogen peroxide, in which the ratio by volume of slurry to hydrogen peroxide is high, particularly comprised between 200 and 500 to 1.

EP-A-0 896 042 describes a mechanical chemical polishing composition comprising a compound capable of attacking tungsten such as hydrogen peroxide and at least one tungsten attack inhibitor such as tetraalkylammonium hydroxide, and the pH of which is less than 7.

The abrasives currently known and intended for polishing aluminium or aluminium alloy, being essentially aluminium or fumed silica based abrasives, do not allow a satisfactory surface quality to be obtained.

SUMMARY OF THE INVENTION

Now, the Applicant has noted in surprising and unexpected fashion that the use of an alkaline aqueous suspension of colloidal silica stabilized by a tetraalkylammonium hydroxide and associated with a oxidizing agent allowed:

an increased polishing speed for an aluminium or aluminium alloy plate, an excellent aluminium surface state to be obtained.

A subject of the present invention is therefore a process for mechanical chemical polishing of a layer of an aluminium or aluminium alloy conducting material used in the microelectronics semi-conductors industry, characterized in that a layer of said material is abraded using an abrasive composition comprising an alkaline aqueous suspension of individualized colloidal silica particles not linked to each other by siloxane bonds, a tetralkylammonium hydroxide and an oxidizing agent.

DESCRIPTION OF THE PREFERRED EMBODIMENTS

According to research carried out by the Applicant, the oxidizing agent is responsible for improving the polishing properties of abrasive compositions of the invention, whilst the tetraalkylammonium hydroxide stabilizes the composition.

The abrasive compositions used according to the invention will notably have a pH comprised between 8 and 12, preferably between 10.5 and 11.

These abrasive compositions can be obtained, for example, using a silica colloidal solution stabilized with sodium. This colloidal solution of silica will thus be treated on a cation exchange resin to eliminate the sodium present, then by tetramethylammonium hydroxide to obtain a stable alkaline aqueous suspension, a subject of the present invention.

Abrasive compositions advantageous for use according to the invention are obtained using colloidal silica with individualized particles, not linked to each other by siloxane bonds and having average particle diameters comprised between 12 nm and 100 nm, preferably between 35 nm and 50 nm and very particularly of approximately 50 nm.

In all the compositions used according to the invention, the abrasive particles are advantageously present in a concentration by weight comprised between 5% and 50%, preferably between 25% and 35%, and very particularly in a concentration of approximately 30%.

The tetraalkylammonium hydroxide used to stabilize the abrasive compositions according to the invention is preferably chosen from tetramethylammonium hydroxide, tetraethylammonium hydroxide, tetrapropylammonium hydroxide and most particularly tetramethylammonium hydroxide.

This tetraalkylammonium hydroxide could preferably be used at a concentration comprised between 0.1% by weight and 1% by weight relative to the initial silica and most particularly at a concentration of approximately 0.4% by weight relative to the initial silica.

The abrasive compositions used in the invention preferably contain between 0.5% and 10% by volume of oxidizing agent. This is notably chosen from chlorates, perchlorates, chlorites, iodates, nitrates, sulphates, perfulphates, peroxides, ozonized water and hydrogen peroxide.

The oxidizing agent will preferably be hydrogen peroxide. A preferred composition above is characterized in that the quantity of hydrogen peroxide diluted to 30% present in said abrasive composition is comprised between 0.5% and 10% by volume relative to the total of said abrasive composition and notably is approximately 7.5% by volume relative to the total of said abrasive composition.

The compositions used in the invention have remarkable properties which justify their use in the polishing of a layer in an aluminium or aluminium alloy based conducting material, being able to be for example an aluminium-copper alloy or an aluminium-silicon-copper alloy.

A further subject of the present Application is an abrasive for mechanical chemical polishing of an aluminium or aluminium alloy conducting material used in the microelectronics semi-conductors industry, characterized in that it contains an abrasive composition which comprises an alkaline aqueous suspension of individualized colloidal silica particles not linked to each other by siloxane bonds, a tetraalkylammonium hydroxide and an oxidizing agent.

Finally, a subject of the present Application is the use of an abrasive composition comprising an alkaline aqueous suspension of individualized colloidal silica particles not linked to each other by siloxane bonds, a tetraalkylammonium hydroxide and an oxidizing agent for mechanical chemical polishing an aluminium or aluminium alloy conducting material used in the microelectronics semi-conductors industry.

Preferred conditions of using the polishing processes described above also apply to the other subjects of the invention envisaged above.

The scope of the invention can be understood better by referring to the examples given below, the aim of which is to explain the advantages of the invention.

EXAMPLE 1

Abrasive Composition 7.5% by volume of hydrogen peroxide diluted to 30% is added to a suspension of colloidal silica stabilized by 0.4% by weight of tetramethylammonium hydroxide (sample PL 1509 from Clariant France SA), the characteristics of which are as follows:

pH of the aqueous suspension: . . . 11 specific surface: . . . 55 $m^2/g$ average diameter of the elementary particles of colloidal silica: . . . 50 nm concentration by weight in colloidal silica: . . . 30%

An abrasive composition according to the invention is thus obtained.

EXAMPLE 2

Example of Mechanical Chemical Polishing

On each plate studied, aluminium of 10000 Å thickness is deposited on a layer of 1600 Å silicon oxide.

The slices are then polished on a PRESI E 460 polisher with the following polishing conditions:

| | |
|---|---|
| applied pressure | 0.2 $daN/cm^2$ |
| turntable speed | 30 rpm |
| head speed | 30 rpm |
| abrasive temperature | 20° C. |
| abrasion rate | 100 $cm^3/mn$ |
| fabric | IC 1000 furrows from Rodel Products | using an abrasive obtained in example 1.

This abrasive composition allows the following results to be obtained:

an aluminium polishing speed of 1700 Å/mn, an excellent surface state (no scratches observed under the optical microscope), a polishing non-uniformity equal to 8%.

COMPARISON EXAMPLE 1

Example of mechanical chemical polishing with an abrasive identical to that of example 1, without the addition of hydrogen peroxide.

Using slices identical to those in example 2 and under the same operating conditions as those in example 2 and using an alkaline aqueous suspension of colloidal silica stabilized by 0.4% by weight of tetramethylammonium hydroxide, the characteristics of which are the following:

pH of the aqueous suspension: ... 11 specific surface: ... 55 m²/g average diameter of elemental particles of colloidal silica: ... 50 nm concentration by weight in colloidal silica: ... 30% the following results are obtained:

an aluminium polishing speed of 1450 Å/mn, a polishing non-uniformity equal to 15%.

Moreover, this suspension generates numerous scratches on the surface of the aluminium.

This poor surface state forbids the use of this process for making interconnecting tracks in aluminium using the damascene process.

COMPARISON EXAMPLE 2

Example of mechanical chemical polishing with an abrasive comprising an alkaline aqueous suspension of colloidal silica stabilized by 1.2% by weight of $NH_3$ (Klebosol® 30 N 50 PHN from Clariant France SA) and comprising 7.5% by volume of hydrogen peroxide diluted to 30%.

Using slices identical to those in example 2 and under the same operating conditions as those in example 2, and using an alkaline aqueous suspension of colloidal silica stabilized by 1.2% by weight of NH3, the characteristics of which are as follows:

pH of the aqueous suspension: ... 11 specific surface: ... 57 m²/g average diameter of the elemental particles of colloidal silica: ... 50 nm concentration by weight in colloidal silica: ... 30% to which 7.5% by volume of hydrogen peroxide diluted to 30% is added, the following results are obtained:

an aluminium polishing speed of 1600 Å/mn, a polishing non-uniformity equal to 10%.

However, it generates numerous scratches on the surface of the aluminium.

This poor surface state forbids the use of this process for making interconnecting tracks in aluminium by the damascene process.

COMPARISON EXAMPLE 3

Example of mechanical chemical polishing with an abrasive comprising an acidic aqueous suspension of colloidal silica (Klebosol® 30 H 50 from Clariant France SA) and 7.5% by volume of hydrogen peroxide diluted to 30%.

Using slices identical to those in example 2 and under the same operating conditions as those of example 2, using an acidic aqueous suspension of colloidal silica, the characteristics of which are the following:

pH of the aqueous suspension: ... 2.2 specific surface: ... 54 m²/g average diameter of the elemental particles of colloidal silica: ... 50 nm concentration by weight in colloidal silica: ... 30% to which 7.5% by volume of hydrogen peroxide diluted to 30% is added, numerous scratches on the surface of the aluminium are generated.

This poor surface state thus forbids the use of the process for making interconnecting tracks in aluminium by the damascene process.

What is claimed is:

1. A process for mechanical chemical polishing of a layer of an aluminium or aluminium alloy conducting material used in the microelectronics semi-conductors industry, characterized in that said aluminium or aluminium alloy layer is abraded using an abrasive composition which comprises an alkaline aqueous suspension of individualized colloidal silica particles not linked to each other by siloxane bonds, a tetraalkylammonium hydroxide and an oxidizing agent.

2. A process according to claim 1, characterized in that the pH of said alkaline aqueous suspension of individualized colloidal silica particles not linked to each other by siloxane bonds is comprised between 8 and 12.

3. A process according to claim 1, characterized in that the pH of said alkaline aqueous suspension of individualized colloidal silica particles not linked to each other by siloxane bonds is from 10.5 to 11.

4. A process according to claim 1, characterized in that the average diameter of the abrasive particles of individualized colloidal silica particles of said composition is comprised between 12 nm and 100 nm.

5. A process according to claim 1, characterized in that the average diameter of the colloidal silica abrasive particles of said composition is comprised between 35 nm and 50 nm.

6. A process according to claim 1, characterized in that the concentration by weight in abrasive particles of said composition is comprised between 5% and 50%.

7. A process according to claim 1, characterized in that the concentration by weight in abrasive particles of said composition is comprised between 25 and 35%.

8. A process according to claim 1, characterized in that the stabilizing agent for individualized colloidal silica particles not linked to each other by siloxane bonds is tetramethylammonium hydroxide, tetraethylammonium hydroxide or tetrapropylammonium hydroxide.

9. A process according to claim 1, characterized in that the quantity of tetralkylammonium hydroxide is comprised between 0.1% by weight and 1% by weight relative to the initial silica.

10. A process according to claim 1, characterized in that the quantity of tetralkylammonium hydroxide is approximately 0.4% by weight relative to the initial silica.

11. A process according to claim 1, characterized in that the oxidizing agent is chosen from chlorates, perchlorates, chlorites, iodates, nitrates, sulphates, persulphates, peroxides, ozonized water and hydrogen peroxide.

12. A process according to claim 1, characterized in that the oxidizing agent is hydrogen peroxide.

13. A process according to claim 12, characterized in that the quantity of hydrogen peroxide diluted to 30% in said abrasive composition is comprised between 0.5% and 10% by volume relative to the total of said abrasive composition.

14. A process according to claim 12, characterized in that the quantity of hydrogen peroxide diluted to 30% in said abrasive composition is approximately 7.5% by volume relative to the total of said abrasive composition.

15. An abrasive for mechanical chemical polishing of an aluminium or aluminium alloy conducting material used in the microelectronics semi-conductors industry, characterized in that it contains an abrasive composition which comprises an alkaline aqueous suspension of individualized colloidal silica particles not linked to each other by siloxane bonds, a tetraalkylammonium hydroxide and an oxidizing agent.

16. Use of an abrasive composition comprising an alkaline aqueous suspension of individualized colloidal silica particles not linked to each other by siloxane bonds, a tetraalkylammonium hydroxide and an oxidizing agent, for mechanical chemical polishing of an aluminium or aluminium alloy conducting material used in the microelectronics semi-conductors industry.

* * * * *